(12) United States Patent
Chen et al.

(10) Patent No.: US 10,504,858 B2
(45) Date of Patent: Dec. 10, 2019

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Meng-Tse Chen, Pingtung County (TW); Ching-Hua Hsieh, Hsinchu (TW); Chung-Shi Liu, Hsinchu (TW); Chih-Wei Lin, Hsinchu County (TW); Hao-Cheng Hou, Hsinchu (TW); Jung-Wei Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/964,091

(22) Filed: Apr. 27, 2018

(65) Prior Publication Data

US 2019/0333870 A1     Oct. 31, 2019

(51) Int. Cl.
*H01L 23/00*     (2006.01)
*H01L 23/31*     (2006.01)
*H01L 23/498*    (2006.01)
*H01L 21/48*     (2006.01)
*H01L 21/56*     (2006.01)
*H01L 21/02*     (2006.01)

(52) U.S. Cl.
CPC ........ *H01L 23/562* (2013.01); *H01L 21/0217* (2013.01); *H01L 21/4857* (2013.01); *H01L 21/568* (2013.01); *H01L 23/3121* (2013.01); *H01L 23/49816* (2013.01); *H01L 23/49827* (2013.01)

(58) Field of Classification Search
CPC ... H01L 23/481; H01L 23/538; H01L 23/562; H01L 21/0217; H01L 21/4857
See application file for complete search history.

(56) References Cited

U.S. PATENT DOCUMENTS

| | | | |
|---|---|---|---|
| 7,276,783 B2 * | 10/2007 | Goller | ........ H01L 21/56 257/678 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |

(Continued)

*Primary Examiner* — Julio J Maldonado
*Assistant Examiner* — John M Parker
(74) *Attorney, Agent, or Firm* — JCIPRNET

(57) ABSTRACT

A package structure including a semiconductor die, a warpage control layer, an insulating encapsulant and a redistribution layer is provided. The semiconductor die has an active surface and a backside surface opposite to the active surface. The warpage control layer is disposed on the backside surface of the semiconductor die, wherein the warpage control layer comprises a material having a Young's Modulus of 100 GPa or more. The insulating encapsulant is encapsulating the semiconductor die and the warpage control layer. The redistribution layer is located on the insulating encapsulant and over the active surface of the semiconductor die.

20 Claims, 8 Drawing Sheets

(56) References Cited

U.S. PATENT DOCUMENTS

| | | |
|---|---|---|
| 9,496,189 B2 | 11/2016 | Yu et al. |
| 10,008,463 B2 * | 6/2018 | Lin .................. H01L 24/19 |
| 2012/0028411 A1 * | 2/2012 | Yu .................. H01L 21/561 |
| | | 438/107 |
| 2012/0119378 A1 * | 5/2012 | Ng .................. H01L 21/561 |
| | | 257/774 |
| 2016/0079136 A1 * | 3/2016 | Chiu .................. H01L 21/78 |
| | | 257/690 |

* cited by examiner

PACKAGE STRUCTURE AND METHOD OF FABRICATING THE SAME

BACKGROUND

In recent years, the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
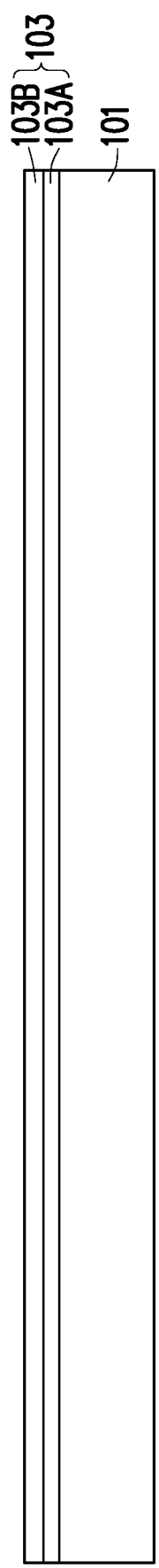
FIG. 1 to FIG. 8 are schematic cross sectional views of various stages in a manufacturing method of a package structure according to some exemplary embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 8 are schematic cross sectional views of various stages in a manufacturing method of a package structure according to some exemplary embodiments. Referring to FIG. 1, in some embodiments, a carrier 101 with a buffer layer 103 coated thereon is provided. In one embodiment, the carrier 101 may be a glass carrier or any suitable carrier for carrying a semiconductor wafer or a reconstituted wafer for the manufacturing method of the package structure.

In some embodiments, the buffer layer 103 includes a de-bonding layer 103A and a dielectric layer 103B, wherein the de-bonding layer 103A is located in between the carrier 101 and the dielectric layer 103B. In certain embodiments, the de-bonding layer 103A is disposed on the carrier 101, and the material of the de-bonding layer 103A may be any material suitable for bonding and de-bonding the carrier 101 from the above layer(s) (e.g., the dielectric layer 103B) or any wafer(s) disposed thereon. In some embodiments, the de-bonding layer 103A may include a release layer (such as a light-to-heat conversion ("LTHC") layer) or an adhesive layer (such as an ultra-violet curable adhesive or a heat curable adhesive layer). In some embodiments, the dielectric layer 103B may be formed above the de-bonding layer 103A. The dielectric layer 103B may be made of dielectric materials such as benzocyclobutene ("BCB"), polybenzoxazole ("PBO"), or any other suitable polymer-based dielectric material. Furthermore, the top surface of the dielectric layer 103B may have a high degree of coplanarity.

It is noted that the materials of the carrier 101, the de-bonding layer 103A and the dielectric layer 103B are not limited to the descriptions of the embodiments. In some alternative embodiments, the dielectric layer 103B may be optionally omitted; in other words, merely the de-bonding layer 103A is formed over the carrier 101. In certain embodiments, a die-attach film may be directly formed on the de-bonding layer 103A for the attachment to above components.

Figure 2:
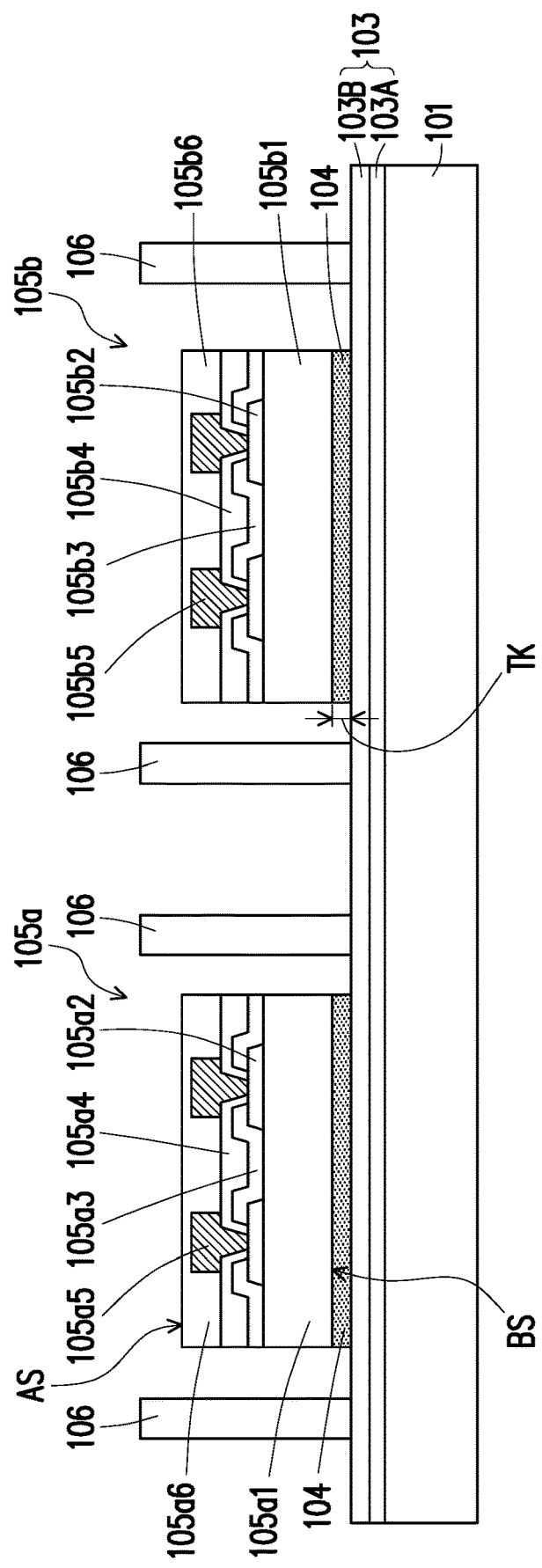

Referring to FIG. 2, after providing the carrier 101 and the buffer layer 103, a plurality through insulator vias 106 is formed on the buffer layer 103 and over the carrier 101, and a plurality of semiconductor dies (105a/105b) is provided on the buffer layer 103. Referring to FIG. 2, in some embodiments, the through insulator vias 106 are through integrated fan-out ("InFO") vias. In some embodiments, the formation of the through insulator vias 106 includes forming a mask pattern (not shown) with openings, then forming a metallic material (not shown) filling up the openings by electroplating or deposition, and removing the mask pattern to form the through insulator vias 106 on the carrier 101. In one embodiment, the material of the through insulator vias 106 may include a metal material such as copper or copper alloys, or the like. However, the disclosure is not limited thereto.

In some embodiments, the semiconductor dies (105a/105b) may be picked and placed on the buffer layer 103. In certain embodiments, each of the semiconductor dies (105a/

105b) have an active surface AS, and a backside surface BS opposite to the active surface AS, wherein a warpage control layer 104 is pre-formed on the backside surface BS of each semiconductor dies (105a/105b). The warpage control layer 104 is, for example, formed of a material having a Young's Modulus of 100 GPa or more (high modulus films). In certain embodiments, the warpage control layer 104 is formed of a material selected from the group consisting of silicon nitride, aluminum nitride, tungsten carbide, boron carbide, silicon carbide, titanium carbide, graphene, diamond-like carbon (DLC), silicon oxide and aluminum oxide. However, the disclosure is not limited thereto. In some other embodiments, the warpage control layer 104 may be any material having a Young's Modulus of 100 GPa or more.

The warpage control layer 104 is for example, formed on the backside surface BS of the semiconductor dies (105a/105b) by low temperature plasma-enhanced chemical vapor deposition (PECVD). For instance, the plasma enhanced chemical vapor deposition is performed at temperatures below 200° C. In one exemplary embodiment, the warpage control layer 104 is silicon nitride (SiN), and the silicon nitride is formed on the backside surface BS of the semiconductor dies (105a/105b) by plasma-enhanced chemical vapor deposition at 175° C. In some embodiments, the warpage control layer 104 is formed in a way such that its sidewalls are aligned with the sidewalls of the semiconductor dies (105a/105b). In some embodiments, the warpage control layer 104 is formed with a thickness TK in a range from 5 μm to 200 μm. For example, a ratio of the thickness TK of the warpage control layer 104 to the thickness of the semiconductor die (105a/105b) is approximately 1:4. By forming such a warpage control layer 104 on the backside surface BS of the semiconductor dies (105a/105b), a coefficient of thermal expansion (CTE) mismatch between materials may be reduced, and a local warpage of the semiconductor dies (105a/105b) during subsequent molding processes may be lowered.

Referring still to FIG. 2, two semiconductor dies (a first semiconductor die 105a, and a second semiconductor die 105b) having warpage control layer 104 formed on the backside surface BS are picked and placed on the buffer layer 103. In the exemplary embodiment, only two semiconductor dies (105a/105b) are illustrated, however, the disclosure is not limited thereto. In other embodiments, the number of semiconductor dies disposed on the carrier 101 may be adjusted based on product requirement. In certain embodiments, the semiconductor dies (105a/105b) and the warpage control layer 104 are attached onto the carrier 101 or attached to the buffer layer 103 through a die attach film (not shown). Each of the first semiconductor die 105a and the second semiconductor die 105b, for example, includes a semiconductor substrate (105a1/105b1), a plurality of conductive pads (105a2/105b2), a passivation layer (105a3/105b3), a post passivation layer (105a4/105b4), a plurality of conductive posts or conductive vias (105a5/105b5), and a protection layer (105a6/105b6).

As illustrated in FIG. 2, the plurality of conductive pads (105a2/105b2) is disposed on the semiconductor substrate (105a1/105b1). The passivation layer (105a3/105b3) is formed over the semiconductor substrate (105a1/105b1) and has openings that partially expose the conductive pads (105a2/105b2) on the semiconductor substrate (105a1/105b1). The semiconductor substrate (105a1/105b1) may be a bulk silicon substrate or a silicon-on-insulator (SOI) substrate, and further includes active components (e.g., transistors or the like) and optionally passive components (e.g., resistors, capacitors, inductors or the like) formed therein. The conductive pads (105a2/105b2) may be aluminum pads, copper pads or other suitable metal pads. The passivation layer (105a3/105b3) may be a silicon oxide layer, a silicon nitride layer, a silicon oxy-nitride layer or a dielectric layer formed of any suitable dielectric materials. In the exemplary embodiment, the post-passivation layer (105a4/105b4) is optionally formed over the passivation layer (105a3/105b3). The post-passivation layer (105a4/105b4) covers the passivation layer (105a3/105b3) and has a plurality of contact openings. The conductive pads (105a2/105b2) are partially exposed by the contact openings of the post passivation layer (105a4/105b4). The post-passivation layer (105a4/105b4) may be a benzocyclobutene (BCB) layer, a polyimide layer, a polybenzoxazole (PBO) layer, or a dielectric layer formed by other suitable polymers. In some embodiments, the conductive posts or conductive vias (105a5/105b5) are formed on the conductive pads (105a2/105b2) by plating. In some embodiments, the protection layer (105a6/105b6) is formed on the post passivation layer (105a4/105b4) covering the conductive posts or conductive vias (105a5/105b5) so as to protect the conductive posts or conductive vias (105a5/105b5).

In some embodiments, the semiconductor dies (105a/105b) placed on the buffer layer 103 may be arranged in an array, and when the semiconductor dies (105a/105b) are arranged in an array, the through insulator vias 106 may be classified into groups. The number of the semiconductor dies may correspond to the number of the groups of the through insulator vias 106. In the illustrated embodiment, the semiconductor dies (105a/105b) may be picked and placed on the buffer layer 103 after the formation of the through insulator vias 106. However, the disclosure is not limited thereto. In some alternative embodiments, the semiconductor dies (105a/105b) may be picked and placed on the buffer layer 103 before the formation of the through insulator vias 106.

Figure 3:
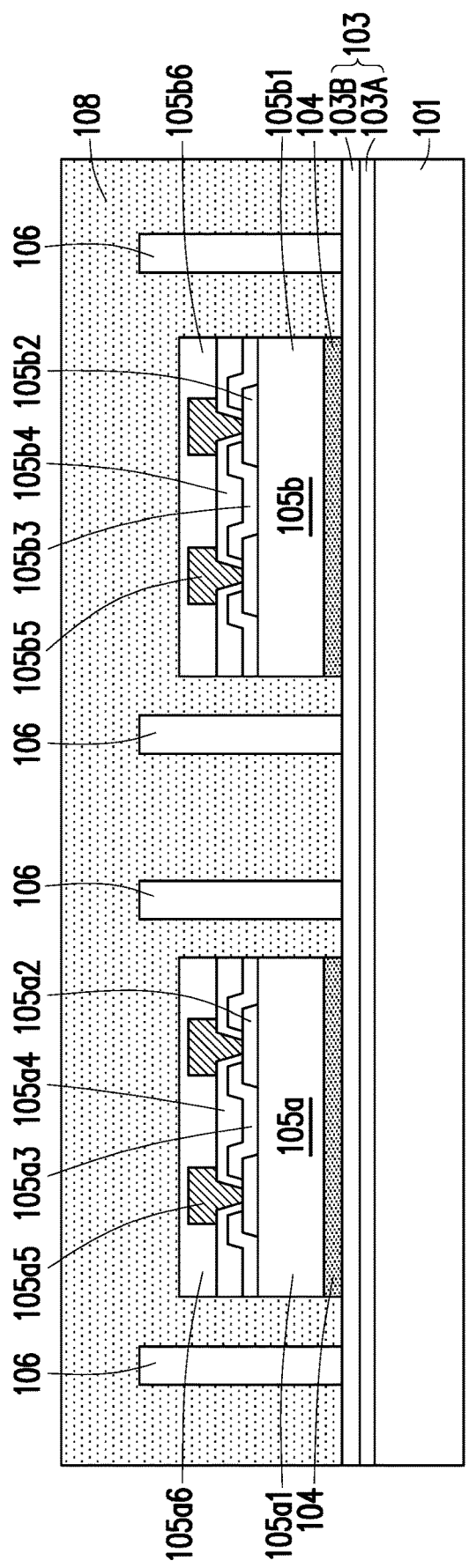

Referring to FIG. 3, an insulating material 108 is formed on the buffer layer 103 and over the semiconductor dies (105a/105b). In some embodiments, the insulating material 108 is formed through, for example, a compression molding process, filling up the gaps between the semiconductor dies (105a/105b) and encapsulating the semiconductor dies (105a/105b) and the warpage control layer 104. The insulating material 108 also fills up the gaps between adjacent through insulator vias 106 to encapsulate the through insulator vias 106. The conductive posts or conductive vias (105a5/105b5) and the protection layer (105a6/105b6) of the semiconductor dies (105a/105b) are encapsulated by and well protected by the insulating material 108. In other words, the conductive posts or conductive vias (105a5/105b5) and the protection layer (105a6/105b6) of the semiconductor dies (105a/105b) are not revealed and are well protected by the insulating material 108.

In some embodiments, the insulating material 108 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 108 may include an acceptable insulating encapsulation material. In some embodiments, the insulating material 108 may further include inorganic filler or inorganic compound (e.g. silica, clay, and so on) which can be added therein to optimize coefficient of thermal expansion (CTE) of the insulating material 108. The disclosure is not limited thereto.

Figure 4:
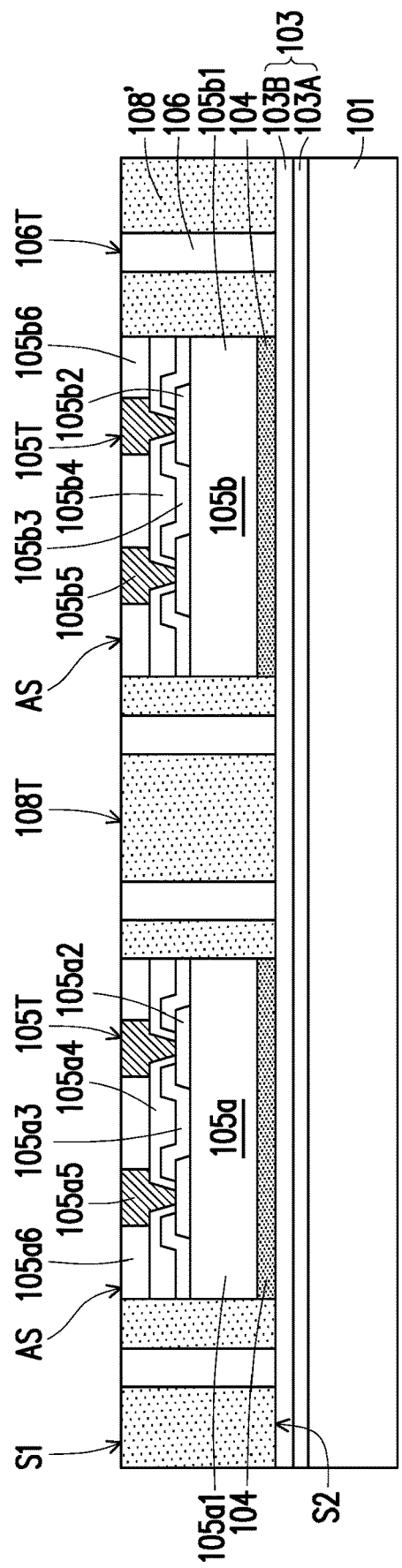

Referring to FIG. 4, in some embodiments, the insulating material 108 is partially removed to expose the conductive posts (105a5/105b5) and the through insulator vias 106. In some embodiments, the insulating material 108 and the protection layer (105a6/105b6) are ground or polished by a planarization step. For example, the planarization step is performed through a mechanical grinding process and/or a chemical mechanical polishing (CMP) process until the top surfaces 105T of the conductive posts (105a5/105b5) are revealed. In some embodiments, the through insulator vias 106 may be partially polished so that the top surfaces 106T of the through insulator vias 106 are levelled with the top surfaces 105T of the conductive posts (105a5/105b5), or levelled with the active surface AS of the semiconductor dies (105a/105b). In other words, the conductive posts (105a5/105b5) and the through insulator vias 106 may also be slightly grinded/polished.

In the illustrated embodiment, the insulating material 108 is polished to form an insulating encapsulant 108'. The insulating encapsulant 108' may have a first surface S1, and a second surface S2 opposite to the first surface S1. For example, the second surface S2 of the insulating encapsulant 108' is in contact with the buffer layer 103. In some embodiments, the top surface 108T (or first surface S1) of the insulating encapsulant 108', the top surface 106T the through insulator vias 106, the top surface 105T of the conductive posts (105a5/105b5), and the top surface of the polished protection layer (105a6/105b6) are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 5:
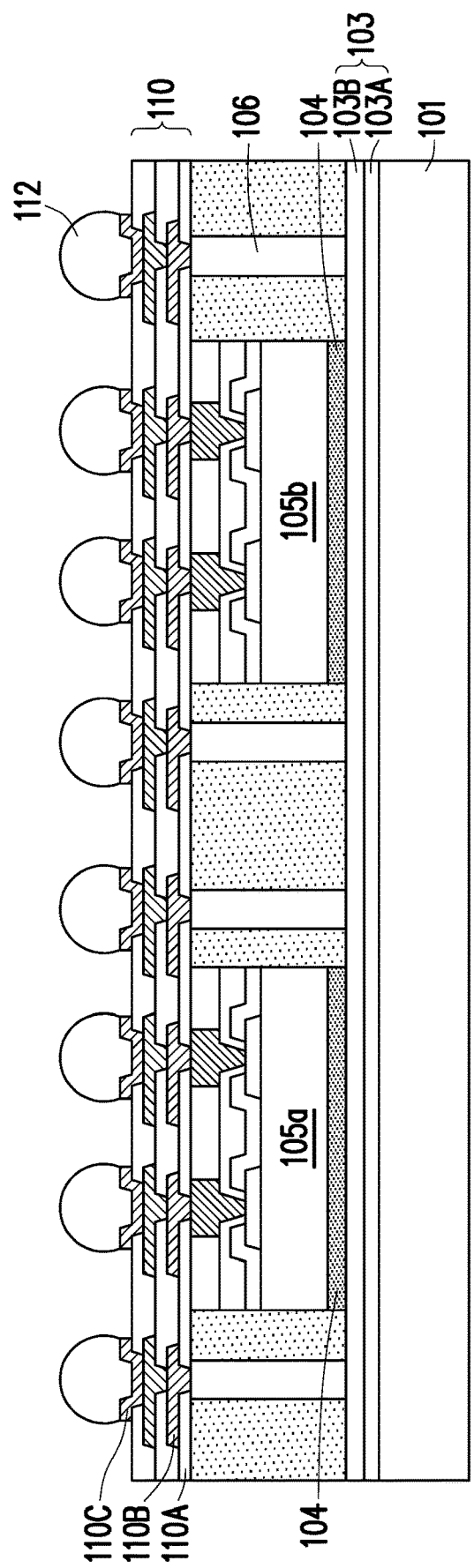

Referring to FIG. 5, after the planarization step, a redistribution layer 110 is formed on the insulating encapsulant 108, the through insulator vias 106 and the semiconductor dies (105a/105b). As shown in FIG. 5, the redistribution layer 110 is formed on the top surface 106T (or first surface S1) of the through insulator vias 106, on the top surfaces 105T of the conductive posts (105a5/105b5), and on the top surface 108T of the insulating encapsulant 108'. In some embodiments, the redistribution layer 110 is electrically connected to the through insulator vias 106, and is electrically connected to the semiconductor dies (105a/105b) through the conductive posts (105a5/105b5). In some embodiments, the semiconductor dies (105a/105b) are electrically connected to the through insulator vias 106 through the redistribution layer 110.

In some embodiments, the formation of the redistribution layer 110 includes sequentially forming one or more dielectric layers 110A, and one or more metallization layers 110B in alternation. In certain embodiments, the metallization layers 110B are sandwiched between the dielectric layers 110A. Although only two layers of the metallization layers 110B and three layers of dielectric layers 110A are illustrated herein, however, the scope of the disclose is not limited by the embodiments of the disclosure. In other embodiments, the number of metallization layers 110B and the dielectric layers 110A may be adjusted based on product requirement. In some embodiments, the metallization layers 110B are electrically connected to the conductive posts (105a5/105b5) of the first semiconductor chip 105a and the second semiconductor chip 105b respectively. Furthermore, the metallization layers 110B are electrically connected to the through insulator vias 106.

In certain embodiments, the material of the dielectric layers 110A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 110A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 110B may be made of conductive materials formed by electroplating or deposition, such as aluminum, titanium, copper, nickel, tungsten, and/or alloys thereof, which may be patterned using a photolithography and etching process. In some embodiments, the metallization layer 110B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 110, plurality of conductive pads 110C may be disposed on an exposed top surface of the topmost layer of the metallization layers 110B for electrically connecting with conductive terminals (e.g. conductive balls). In certain embodiments, the conductive pads 110C are for example, under-ball metallurgy (UBM) patterns used for ball mount. As shown in FIG. 5, the conductive pads 110C are formed on and electrically connected to the redistribution layer 110. In some embodiments, the materials of the conductive pads 110C may include copper, nickel, titanium, tungsten, or alloys thereof or the like, and may be formed by an electroplating process, for example. The number of conductive pads 110C are not limited in this disclosure, and may be selected based on the design layout. In some alternative embodiments, the conductive pads 110C may be omitted. In other words, conductive terminals 112 formed in subsequent steps may be directly disposed on the redistribution layer 110.

As illustrated in FIG. 5, after forming the conductive pads 110C, a plurality of conducive terminals 112 are disposed on the conductive pads 110C and over the redistribution layer 110. In some embodiments, the conductive terminals 112 may be disposed on the conductive pads 110C by ball placement process or reflow process. In some embodiments, the conductive terminals 112 are, for example, solder balls or ball grid array (BGA) balls. In some embodiments, the conductive terminals 112 are connected to the redistribution layer 110 through the conductive pads 110C. In certain embodiments, some of the conductive terminals 112 may be electrically connected to the semiconductor dies (105a/105b) through the redistribution layer 110. Furthermore, some of the conductive terminals 112 may be electrically connected to the through insulator vias 106 through the redistribution layer 110. The number of the conductive terminals 112 is not limited to the disclosure, and may be designated and selected based on the number of the conductive pads 110C.

Figure 6:
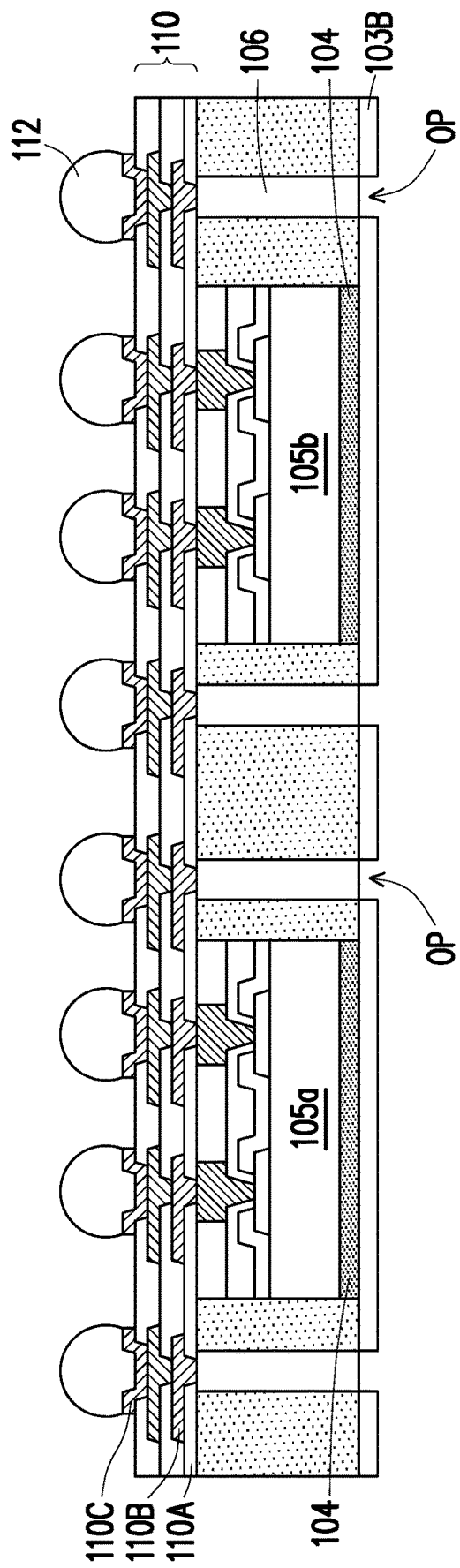

Referring to FIG. 6, in some embodiments, after forming the redistribution layer 110 and the conductive terminals 112, the structure shown in FIG. 5 may be attached to a tape supported by a frame (not shown). Subsequently, the carrier 101 may be de-bonded so as to separate the semiconductor dies (105a/105b) and the dielectric layer 103B from the carrier 101. In the exemplary embodiment, the de-bonding process includes projecting a light such as a laser light or an UV light on the de-bonding layer 103A (e.g., the LTHC release layer), such that the carrier 101 can be easily removed. In certain embodiments, the de-bonding layer 103A may be further removed or peeled off. In some embodiments, the dielectric layer 103B may remain on the insulating encapsulant 108' after de-bonding the carrier 101. As shown in FIG. 6, the remaining dielectric layer 103B may then be patterned such that a plurality of contact openings OP is formed to expose the bottom surfaces of the through insulator vias 106. The number of the contact openings OP is corresponding to the number of the through insulator vias 106. In some embodiments, the contact openings OP of the dielectric layer 103B is formed by laser drilling process.

Figure 7:
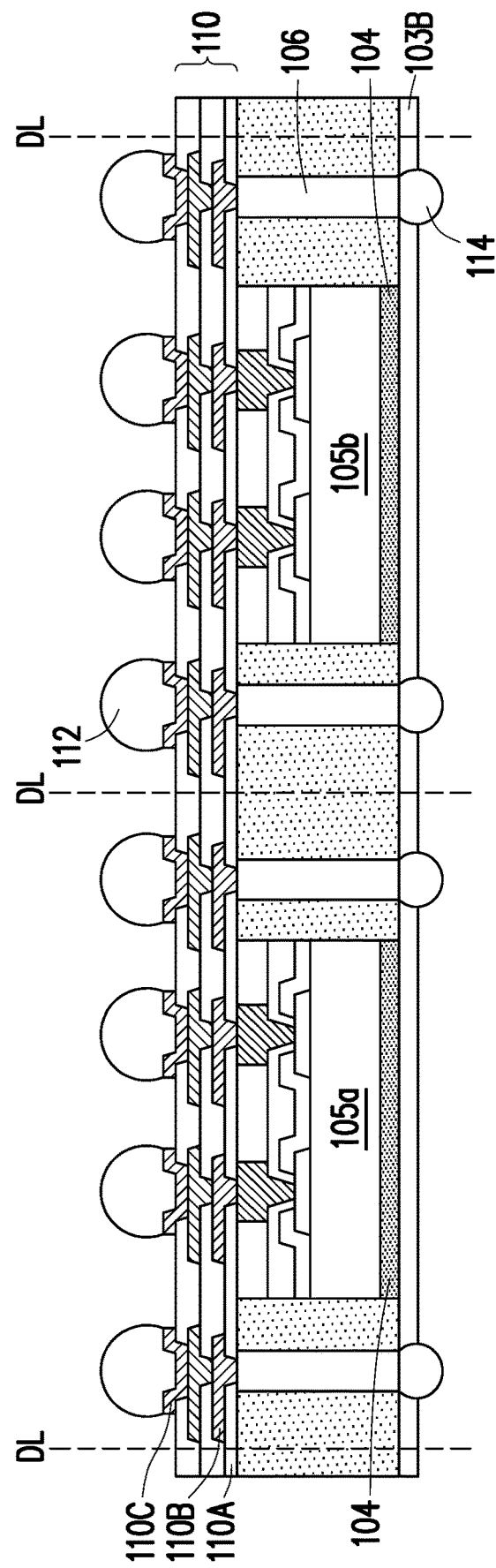

Referring to FIG. 7, after the contact openings OP is formed in the dielectric layer 103B, a plurality of conductive balls 114 is placed on the bottom surfaces of the through insulator vias 106 to fill into the contact openings OP. In some embodiments, the conductive balls 114 are, for example, reflowed to bond with the bottom surfaces of the through insulator vias 106. As shown in FIG. 7, after the conductive balls 114 are formed, a structure having dual-side terminals may be accomplished.

Figure 8:
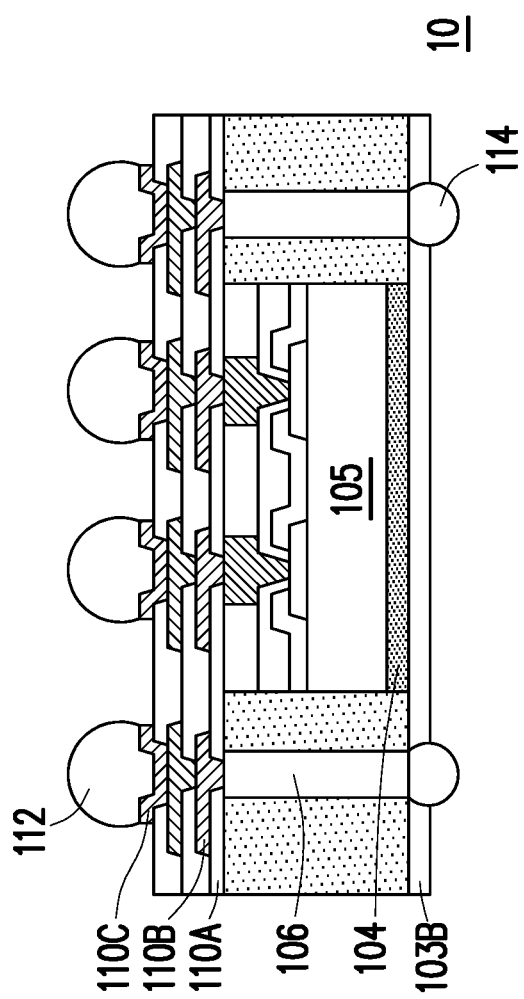

Referring to FIG. 8, in some embodiments, a dicing process is performed to cut the whole package structure (at least cutting though the insulating encapsulant 108' and the redistribution layer 110) along the dicing lanes DL (shown in FIG. 7) into individual and separated semiconductor dies/semiconductor packages 10. In one embodiment, the dicing process is a wafer dicing process including mechanical blade sawing or laser cutting. Up to here, the manufacture of the package structure 10 is completed. In the completed structure, the package structure 10, for example, includes a semiconductor die 105, a warpage control layer 104, a plurality of through insulator vias 106, an insulating encapsulant 108', and a redistribution layer 110. In some embodiments, the warpage control layer 104 is sandwiched in between the backside surface BS of the semiconductor die 105 and the dielectric layer 103B. In certain embodiments, the insulating encapsulant 108' is at least encapsulating the warpage control layer 104, the semiconductor die 105 and the plurality of through insulator vias.

In some embodiments, the package structure 10 may be further mounted with an additional package, chips/dies or other electronic devices to form a stacked package structure. For example, the package structure 10 may be further mounted with an additional package, chips/dies or other electronic devices to form a package-on-package (POP) structure through the conductive balls 114 and/or other additional connectors based on the demand.

In the above-mentioned embodiments, at least a warpage control layer is pre-formed on the backside surface of the semiconductor die through low temperature plasma-enhanced chemical vapor deposition. The warpage control layer is a material having a Young's Modulus of 100 GPa or more. By having such a warpage control layer disposed on the backside surface of the semiconductor die, a coefficient of thermal expansion (CTE) mismatch between materials may be reduced, and a local warpage of the semiconductor dies during the molding processes may be lowered. With a good local warpage control, a lithography process window may be enlarged, and a fine line width/spacing in the package structure may be achieved.

In accordance with some embodiments of the present disclosure, a package structure including a semiconductor die, a warpage control layer, an insulating encapsulant and a redistribution layer is provided. The semiconductor die has an active surface and a backside surface opposite to the active surface. The warpage control layer is disposed on the backside surface of the semiconductor die, wherein the warpage control layer comprises a material having a Young's Modulus of 100 GPa or more. The insulating encapsulant is encapsulating the semiconductor die and the warpage control layer. The redistribution layer is located on the insulating encapsulant and over the active surface of the semiconductor die.

In accordance with some other embodiments of the present disclosure, a method of fabricating a package structure is described. The method includes the following steps. A semiconductor die is provided, the semiconductor die has an active surface and a backside surface opposite to the active surface. A warpage control layer is formed on the backside surface of the semiconductor die, wherein the warpage control layer is formed of a material having a Young's Modulus of 100 GPa or more. The semiconductor die and the warpage control layer are bonded onto a carrier. An insulating encapsulant is formed on the carrier to encapsulate the semiconductor die and the warpage control layer. A redistribution layer is formed on the insulating encapsulant, wherein the redistribution layer is electrically connected to the semiconductor die. The carrier is de-bonded.

In accordance with yet another embodiment of the present disclosure, a method of fabricating a package structure is described. The method includes the following steps. A semiconductor die is provided, the semiconductor die has an active surface and a backside surface opposite to the active surface. A warpage control layer is formed on the backside surface of the semiconductor die by plasma-enhanced chemical vapor deposition, wherein the plasma enhanced chemical vapor deposition is performed at temperatures below 200° C. The semiconductor die and the warpage control layer are bonded onto a carrier. A plurality of through insulator vias is formed on the carrier to surround the semiconductor die and the warpage control layer. An insulating encapsulant is formed on the carrier to encapsulate the semiconductor die, the warpage control layer and the plurality of through insulator vias, wherein the insulating encapsulant has a first surface and a second surface opposite to the first surface. A redistribution layer is formed on the first surface of the insulating encapsulant and electrically connected to the semiconductor die. The carrier is de-bonded. A plurality of conductive balls is formed on the second surface of the insulating encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of fabricating a package structure, comprising:
    providing a semiconductor die, the semiconductor die has an active surface and a backside surface opposite to the active surface;

forming a warpage control layer on the backside surface of the semiconductor die, wherein the warpage control layer is formed of a material having a Young's Modulus of 100 GPa or more;

bonding the semiconductor die and the warpage control layer onto a carrier;

forming a plurality of through insulator vias on the carrier, wherein the plurality of through insulator vias is surrounding the semiconductor die;

forming an insulating encapsulant on the carrier after forming the plurality of through insulator vias to encapsulate the semiconductor die, the warpage control layer and the plurality of through insulator vias;

forming a redistribution layer on the insulating encapsulant, wherein the redistribution layer is electrically connected to the semiconductor die; and de-bonding the carrier.

2. The method of fabricating the package structure according to claim 1, wherein the warpage control layer is formed of a material selected from the group consisting of silicon nitride, aluminum nitride, tungsten carbide, boron carbide, silicon carbide, titanium carbide, graphene, diamond-like carbon (DLC), silicon oxide formed by low temperature plasma-enhanced chemical vapor deposition, and aluminum oxide.

3. The method of fabricating the package structure according to claim 1, wherein the warpage control layer is formed of silicon nitride.

4. The method of fabricating the package structure according to claim 1, wherein the warpage control layer is formed with a thickness in a range of 5 μm to 200 μm.

5. The method of fabricating the package structure according to claim 1, further comprising:

forming a plurality of conductive terminals on the redistribution layer, wherein the plurality of conductive terminals is electrically connected to the semiconductor die through the redistribution layer.

6. The method of fabricating the package structure according to claim 1, wherein the semiconductor die and the warpage control layer are bonded onto the carrier through a die attach film.

7. The method of fabricating the package structure according to claim 1, further comprising:

forming a plurality of conductive balls on the plurality of through insulator vias after de-bonding the carrier.

8. A method of fabricating a package structure, comprising:

providing a semiconductor die, the semiconductor die has an active surface and a backside surface opposite to the active surface;

forming a warpage control layer on the backside surface of the semiconductor die by plasma-enhanced chemical vapor deposition, wherein the plasma enhanced chemical vapor deposition is performed at temperatures below 200° C.;

bonding the semiconductor die and the warpage control layer onto a carrier;

forming a plurality of through insulator vias on the carrier to surround the semiconductor die and the warpage control layer;

forming an insulating encapsulant on the carrier to encapsulate the semiconductor die, the warpage control layer and the plurality of through insulator vias, wherein the insulating encapsulant has a first surface and a second surface opposite to the first surface;

forming a redistribution layer on the first surface of the insulating encapsulant, wherein the redistribution layer is electrically connected to the semiconductor die;

de-bonding the carrier; and forming a plurality of conductive balls on the second surface of the insulating encapsulant.

9. The method of fabricating the package structure according to claim 8, wherein the warpage control layer is formed of a material having a Young's Modulus of 100 GPa or more.

10. The method of fabricating the package structure according to claim 8, wherein the warpage control layer is formed of a material selected from the group consisting of silicon nitride, aluminum nitride, tungsten carbide, boron carbide, silicon carbide, titanium carbide, graphene, diamond-like carbon (DLC), silicon oxide and aluminum oxide.

11. The method of fabricating the package structure according to claim 8, wherein the warpage control layer is formed of silicon nitride.

12. The method of fabricating the package structure according to claim 8, wherein the warpage control layer is formed with a thickness in a range of 5 μm to 200 μm.

13. The method of fabricating the package structure according to claim 8, further comprising:

forming a plurality of conductive terminals on the redistribution layer, wherein the plurality of conductive terminals is electrically connected to the semiconductor die through the redistribution layer.

14. The method of fabricating the package structure according to claim 8, wherein the semiconductor die and the warpage control layer are bonded onto the carrier through a die attach film.

15. A method of fabricating a package structure, comprising:

providing a semiconductor die having a warpage control layer formed thereon, wherein the semiconductor die comprises a semiconductor substrate located at a backside of the semiconductor die, and a plurality of conductive posts located at an active surface opposite to the backside of the semiconductor die, and the warpage control layer is attached to the backside of the semiconductor die on the semiconductor substrate, and formed with a material having a Young's Modulus of 100 GPa or more;

bonding the semiconductor die onto a carrier through the warpage control layer; and forming a plurality of through insulator vias on the carrier, wherein the plurality of through insulator vias is surrounding the semiconductor die;

forming an insulating encapsulant on the carrier after forming the plurality of through insulator vias to encapsulate the semiconductor die, the warpage control layer and the plurality of through insulator vias.

16. The method of fabricating the package structure according to claim 15, further comprising:

forming a redistribution layer on the insulating encapsulant, wherein the redistribution layer is electrically connected to the semiconductor die; and de-bonding the carrier.

17. The method of fabricating the package structure according to claim 16, further comprising:

forming a plurality of conductive terminals on the redistribution layer, wherein the plurality of conductive terminals is electrically connected to the semiconductor die through the redistribution layer.

18. The method of fabricating the package structure according to claim 16, further comprising:

forming a plurality of conductive balls on the plurality of through insulator vias after de-bonding the carrier.

19. The method of fabricating the package structure according to claim 15, wherein the semiconductor die and the warpage control layer are bonded onto the carrier through a die attach film.

20. The method of fabricating the package structure according to claim 15, wherein after bonding the semiconductor die onto the carrier, the warpage control layer is sandwiched in between the semiconductor substrate and the carrier.

\* \* \* \* \*